(12) United States Patent
Ye et al.

(10) Patent No.: US 12,532,781 B2
(45) Date of Patent: Jan. 20, 2026

(54) STACKED CAPACITORS FOR SEMICONDUCTOR DEVICES AND ASSOCIATED SYSTEMS AND METHODS

(71) Applicant: Micron Technology, Inc., Boise, ID (US)

(72) Inventors: Seng Kim Ye, Singapore (SG); Kelvin Tan Aik Boo, Singapore (SG); Hong Wan Ng, Singapore (SG); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 588 days.

(21) Appl. No.: 17/899,592

(22) Filed: Aug. 30, 2022

(65) Prior Publication Data

US 2024/0072022 A1 Feb. 29, 2024

(51) Int. Cl.
| | |
|---|---|
| H01L 25/16 | (2023.01) |
| H01G 2/06 | (2006.01) |
| H01G 13/00 | (2013.01) |
| H01L 23/00 | (2006.01) |
| H01L 25/065 | (2023.01) |
| H01L 25/18 | (2023.01) |

(52) U.S. Cl.
CPC ............... *H01L 25/16* (2013.01); *H01G 2/06* (2013.01); *H01G 13/00* (2013.01); *H01L 24/48* (2013.01); *H01L 24/49* (2013.01); *H01L 25/0657* (2013.01); *H01L 25/18* (2013.01); *H01L 24/16* (2013.01); *H01L 2224/16225* (2013.01); *H01L 2224/48106* (2013.01); *H01L 2224/48145* (2013.01); *H01L 2224/48195* (2013.01); *H01L 2224/48227* (2013.01); *H01L 2224/49175* (2013.01); *H01L 2225/06506* (2013.01); *H01L 2225/0651* (2013.01); *H01L 2225/06517* (2013.01); *H01L 2225/06562* (2013.01); *H01L 2924/1431* (2013.01); *H01L 2924/1434* (2013.01); *H01L 2924/19041* (2013.01); *H01L 2924/19105* (2013.01)

(58) Field of Classification Search
CPC .............................................. H01L 2924/19041
See application file for complete search history.

(56) References Cited

U.S. PATENT DOCUMENTS 12,033,924 B2 * 7/2024 Lee ................... H01L 23/49811

* cited by examiner

*Primary Examiner* — Yu-Hsi D Sun
(74) *Attorney, Agent, or Firm* — Dorsey & Whitney LLP

(57) ABSTRACT

Semiconductor devices, and related systems and methods, are disclosed herein. In some embodiments, the stacked semiconductor device includes a package substrate having an inner surface, a die stack carried by the inner surface, and a stacked capacitor device carried by the inner surface adjacent to the die stack. The die stack can include one or more semiconductor dies, each of which can be electrically coupled to the inner surface by one or more bond wires and/or solder structures. The stacked capacitor device can include a first capacitor having a lower surface attached to the inner surface of the package substrate, a interposer having a first side attached to an upper surface of the first capacitor, and a second capacitor attached to a second side of the interposer opposite the first side.

18 Claims, 8 Drawing Sheets ional demands on decreasing size, individual semiconductor dies and/or active components are typically manufactured in bulk and then stacked on a support substrate (e.g., a printed circuit board (PCB) or other suitable substrates). The stacked dies can then be coupled to the support substrate (sometimes also referred to as a package substrate) through bond wires in shingle-stacked dies (e.g., dies stacked with an offset for each die) and/or through substrate vias (TSVs) between the dies and the support substrate.

STACKED CAPACITORS FOR SEMICONDUCTOR DEVICES AND ASSOCIATED SYSTEMS AND METHODS

TECHNICAL FIELD

The present technology is generally related to stacked capacitors for semiconductor devices systems and methods.

BACKGROUND

Microelectronic devices, such as memory devices, microprocessors, and other electronics, typically include one or more semiconductor dies mounted to a substrate and encased in a protective covering. The semiconductor dies include functional features, such as memory cells, processor circuits, imager devices, interconnecting circuitry, etc. To meet continual demands on decreasing size, individual semiconductor dies and/or active components are typically manufactured in bulk and then stacked on a support substrate (e.g., a printed circuit board (PCB) or other suitable substrates). The stacked dies can then be coupled to the support substrate (sometimes also referred to as a package substrate) through bond wires in shingle-stacked dies (e.g., dies stacked with an offset for each die) and/or through substrate vias (TSVs) between the dies and the support substrate.

Figure 1:
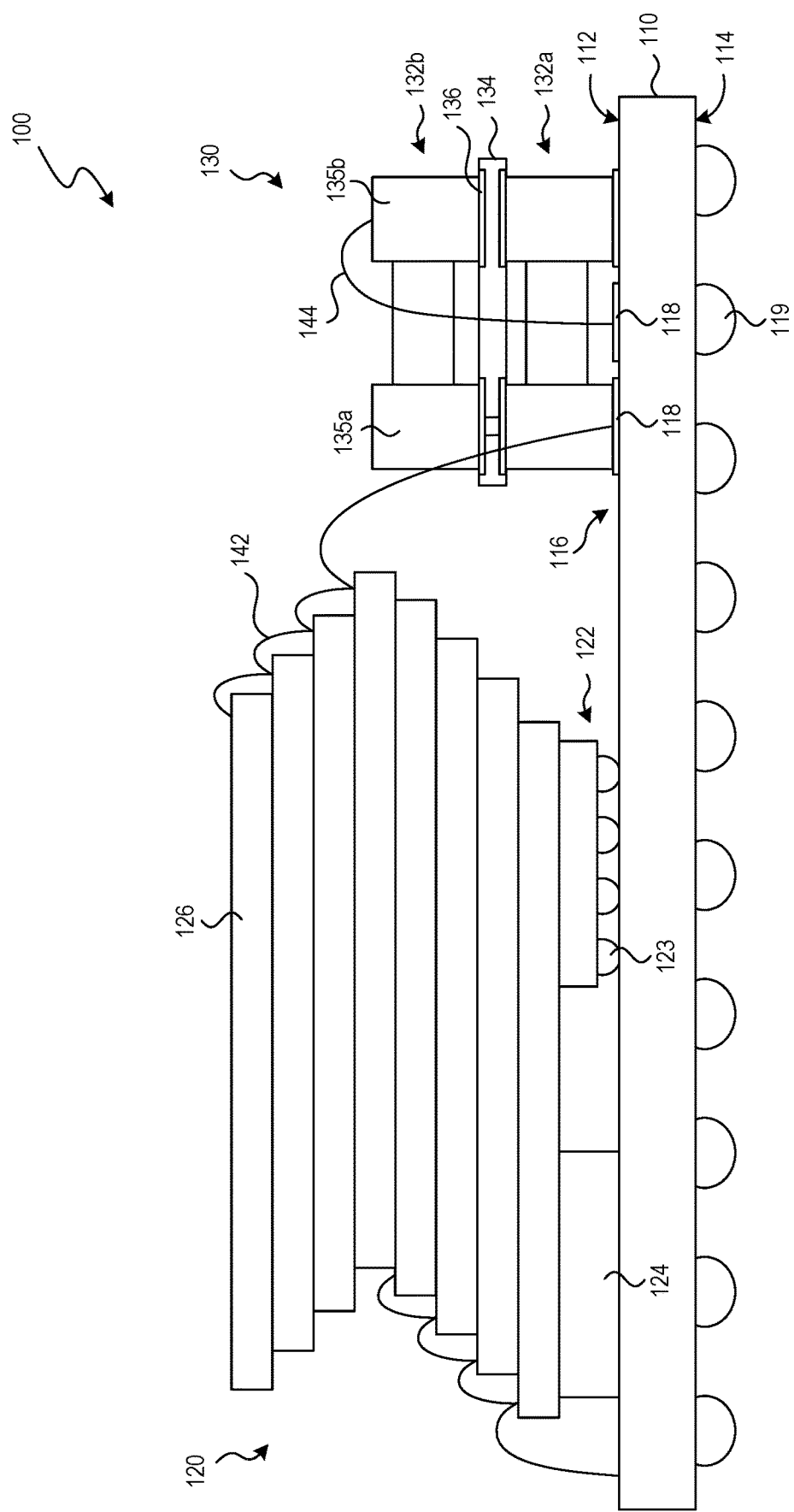
FIG. 1 is a partially schematic cross-sectional view of a semiconductor device configured in accordance with some embodiments of the present technology.

The drawings have not necessarily been drawn to scale. Further, it will be understood that several of the drawings have been drawn schematically and/or partially schematically. Similarly, some components and/or operations can be separated into different blocks or combined into a single block for the purpose of discussing some of the implementations of the present technology. Moreover, while the technology is amenable to various modifications and alternative forms, specific implementations have been shown by way of example in the drawings and are described in detail below. The intention, however, is not to limit the technology to the particular implementations described.

DETAILED DESCRIPTION

Specific details of several embodiments of semiconductor assemblies, stacked capacitor devices, and associated systems and methods are described below. The term "semiconductor device or die" generally refers to a solid-state device that includes one or more semiconductor materials. Examples of semiconductor devices include logic devices, memory devices, controllers, or microprocessors (e.g., central processing unit (CPU), graphics processing unit (GPU)), among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished functional device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition (CVD), physical vapor deposition (PVD), atomic layer deposition (ALD), spin coating, plating, and/or other suitable techniques. Similarly, materials can be removed, for example, using plasma etching, wet etching, chemical-mechanical planarization, or other suitable techniques. Some of the techniques may be combined with photolithography processes. A person skilled in the relevant art will also understand that the technology may have additional embodiments and that the technology may be practiced without several of the details of the embodiments described herein with reference to FIGS. 1-9.

Semiconductor devices, and related systems and methods, are disclosed herein. In some embodiments, the stacked semiconductor device (sometimes also referred to herein as a "semiconductor device assembly") includes a package substrate having an active surface, a die stack carried by the active surface, and a stacked capacitor device carried by the active surface adjacent to the die stack. The die stack can include one or more semiconductor dies, each of which can be electrically coupled to the active surface by one or more bond wires and/or solder structures. The stacked capacitor device can include a first capacitor having a lower surface attached to the active surface of the package substrate, an interposer having a first side attached to an upper surface of the first capacitor, and a second capacitor attached to a second side of the interposer opposite the first side.

The first and second capacitors can be at least partially (or fully) vertically aligned, thereby reducing the longitudinal footprint of the capacitors for the stacked semiconductor device. As a result, the overall size of the stacked semiconductor device can be reduced and/or additional room can be made available for electrical connections to the semiconductor dies in the die stack. For example, the additional room can provide flexibility for the formation of bond fingers and/or other redistribution structures, can provide room for additional bond wires and signal routes, and/or can provide space between bond wires to avoid problems associated with wire sweep. In example (e.g., when the first and second capacitors are fully vertically aligned), the stacked capacitor component can reduce the length (or width) of the stacked semiconductor device by at least one length (width) of the stacked capacitors (e.g., by omitting the extra peripheral space required to space the capacitors apart).

In some embodiments, corresponding terminals of the first and second capacitors are coupled to the active surface of the package substrate in parallel. For example, a first terminal of the first capacitor can be electrically coupled to the active surface of the package substrate through a solder structure (e.g., formed by a solder mount technology (SMT) process). A corresponding terminal of the second capacitor can then be coupled to the first terminal through a conductive via in the interposer. In a specific, non-limiting example, the corresponding terminals in the first and second capacitors can each be ground terminals.

In some embodiments, the device includes a bond wire electrically coupling a terminal of the second capacitor to the active surface of the package substrate. For example, the interposer can include a porch region that overhangs the package substrate and includes a bonding region (e.g., a redistribution component) formed on the second surface in the porch region. In this example, the terminal of the second capacitor can be electrically coupled to the bonding region and the bond wire can be electrically coupled between the bonding region and the active surface. In another example, the bond wire can be directly coupled between the terminal of the second capacitor and the active surface of the package substrate.

In some embodiments, the die stack includes a controller die carried by an uppermost die one of the one or more semiconductor dies. In such embodiments, the second capacitor can be electrically coupled directly to the controller die via one or more bond wires extending therebetween.

In some embodiments, the first capacitor has a first footprint, and the second capacitor has a second footprint generally equal to the first footprint (e.g., the second longitudinal footprint has a second longitudinal surface area within 10 percent of a first longitudinal surface area of the first longitudinal footprint, within 5 percent of the first longitudinal surface area, within 2 percent of the first longitudinal surface area, or within 1 percent of the first longitudinal surface area). In such embodiments, the first and second dies can be generally (or fully) vertically aligned, such that the first and second footprints substantially (or completely) overlap. In some such embodiments, the interposer has a third footprint that substantially (or completely) overlaps with the first and second footprints.

Additional details on the stacked semiconductor devices, methods for forming the same, and associated systems and methods are set out below. For ease of reference, the semiconductor assemblies (and their components) are sometimes described herein with reference to front and back, top and bottom, upper and lower, upwards and downwards, and/or horizontal plane, x-y plane, vertical, or z-direction relative to the spatial orientation of the embodiments shown in the figures. It is to be understood, however, that the semiconductor assemblies (and their components) can be moved to, and used in, different spatial orientations without changing the structure and/or function of the disclosed embodiments of the present technology.

Further, although the stacked capacitors disclosed herein are primarily discussed in the context of a stacked die package, one of skill in the art will understand that the scope of the technology is not so limited. For example, the stacked capacitor devices can also be deployed in various other settings (e.g., in a single die package, on a motherboard, and/or in any other suitable setting) to reduce the longitudinal space required for multiple capacitors.

FIG. 1 is a partially schematic cross-sectional view of a stacked semiconductor device 100 configured in accordance with some embodiments of the present technology. The stacked semiconductor device 100 ("device 100") includes a package substrate 110 (sometimes also referred to as a "support substrate") that has a first surface 112 (e.g., an "upper" or "inner" surface) and a second surface 114 (e.g., a "lower" or "outer" surface) opposite the first surface 112. The package substrate 110 can include a redistribution layer 116 at the first surface 112 that provides an electrical connection between various components attached to the first surface 112. Additionally, the package substrate 110 can include one or more redistribution features 117 (shown schematically) that electrically couple the first surface 112 and the second surface 114 (e.g., conductive vias, interconnects, metallization layers, and the like). As a result, the redistribution layer 116 at the first surface 112 can be electrically coupled to one or more package interconnects 119 at the second surface 114, thereby allowing components of the device 100 to be coupled to external components (e.g., other devices, controllers, a motherboard, and the like).

As further illustrated in FIG. 1, the device 100 includes a stack of semiconductor dies 120 ("die stack 120") carried by the first surface 112 and includes one or more semiconductor dies (nine shown). For example, in the illustrated embodiment, the die stack 120 includes a controller die 122 attached to the first surface 112, a spacer 124 attached to the first surface 112 adjacent to the controller die 122, and eight stacked dies 126 carried by the controller die 122 and the spacer 124. In various embodiments, the stacked dies 126 can be logic dies, memory dies, and/or any other suitable semiconductor die. The device 100 also includes stacked capacitor component 130 is carried by the first surface 112 adjacent to the die stack 120. The stacked capacitor component 130 (sometimes referred to herein as a "multi-capacitor component") includes two or more capacitors 132 (two shown, referred to individually herein as a "first capacitor 132a" and a "second capacitor 132b") and an interposer 134 (e.g., a printed circuit board). The first capacitor 132a is attached to the first surface 112 of the package substrate 110, the interposer 134 is attached to a top of the first capacitor 132a, and the second capacitor 132b is attached to a top of the interposer 134. The stacked configuration results in the first and second capacitors 132a, 132b being at least partially vertically aligned, thereby reducing the longitudinal footprint required for the two capacitors in the device 100.

As further illustrated in FIG. 1, the die stack 120 and the stacked capacitor component 130 have a variety of electrical connections to the package substrate 110. For example, the controller die 122 can be electrically coupled to the redistribution layer 116 through one or more (four shown) solder structures 123 (e.g., solder balls, sometimes referred to as a "flip chip connection" for the controller die 122) while each of the stacked dies 126 can be electrically coupled to the redistribution layer 116 through one or more die bond wires 142. The die bond wires 142 extend between the stacked dies 126 and/or a bonding location 118 (e.g., a bonding region, a bond pad, bond finger, landing pad, and the like) on the redistribution layer 116.

Each of the first and second capacitors 132a, 132b has a first terminal 135a and a second terminal 135b opposite the first terminal 135a (each labeled on the second capacitor 132b). Each of the first and second terminals 135a, 135b on the first capacitor 132a can be electrically coupled to a corresponding bonding location 118 through a solder joint, thereby physically and electrically coupling the first capacitor 132a to the first surface 112. The second capacitor 132b, in contrast, can have a hybrid coupling to the package substrate 110. For example, the first terminal 135a of the second capacitor 132b can be coupled to the redistribution layer 116 through the interposer 134 and the first capacitor 132a while the second terminal 135b is electrically coupled the redistribution layer 116 through one or more capacitor bond wires 144 (one shown). In some embodiments, the first and second capacitors 132a,132b are arranged to form parallel capacitors. In some embodiments, the first and second capacitors 132a,132b are arranged to form serial capacitors. In some embodiments, the first and second capacitors 132a,132b are arranged as fully independent capacitors (e.g., independently coupled to different components of the device 100). Additional details on the electrical connection of the stacked capacitor component 130 are provided below with reference to FIGS. 2-5.

Figure 2:
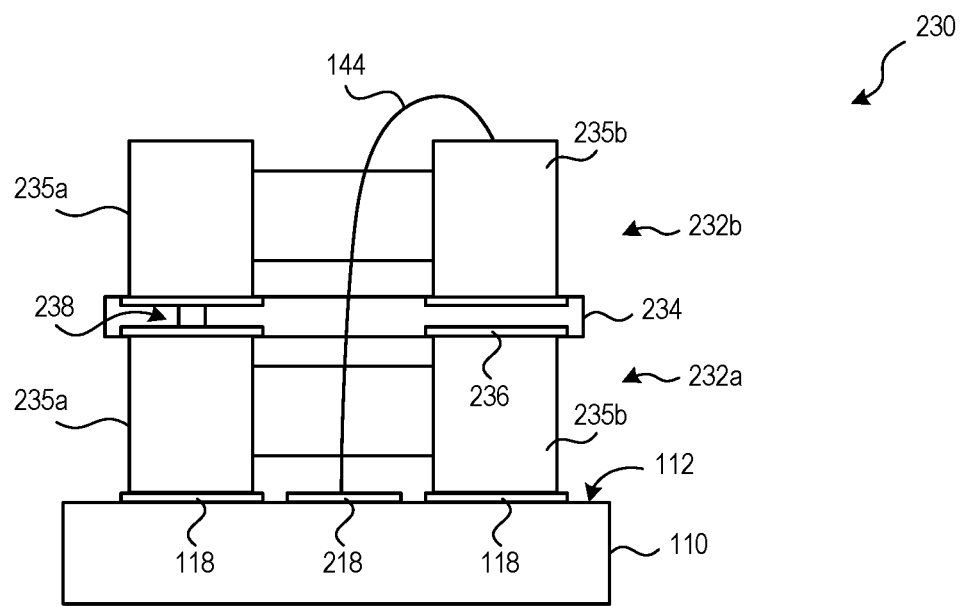
FIG. 2 is a partially schematic cross-sectional view of a stacked capacitor component configured in accordance with some embodiments of the present technology.

For example, FIG. 2 is a partially schematic cross-sectional view of a stacked capacitor component 230 configured in accordance with some embodiments of the present technology. Similar to the stacked capacitor component 130 discussed above with reference to FIG. 1, the stacked capacitor component 230 includes two or more capacitors 232 (two shown, referred to individually herein as a "first capacitor 232a" and a "second capacitor 232b") and an interposer 234. In the illustrated embodiment, first and second terminals 235a, 235b of the first capacitor 232a are attached and electrically coupled to corresponding bond locations 118 of the package substrate 110 through solder joint connections (e.g., through a surface mount technology (SMT) process).

The interposer 234 and the second capacitor 232b can then be attached to the package substrate 110 through similar solder joints. For example, the interposer 234 can include one or more intermediate bond regions 236 (e.g., bond pads, bond fingers, conductive traces with contact pads, and the like) at each surface of the interposer 234 and one or more vias 238 extending between the intermediate bond regions 236. As a result, the interposer 234 can be attached and electrically coupled to a top of the first capacitor 232a through an SMT process between the intermediate bond regions 236 and the first capacitor 232a. Similarly, the second capacitor 232b can be attached to a top of the interposer 234 through an SMT process between the intermediate bond regions 236 and the second capacitor 232b.

In the illustrated embodiment, the first terminal 235a of the first and second capacitors 232a, 232b are coupled to the package substrate 110 in parallel. More specifically, the interposer 234 includes a conductive via 238 extending between the intermediate bond regions 236 coupled to the first terminal 235a of the first and second capacitors 232a, 232b. As a result, the first terminal 235a of the second capacitor 232b is electrically coupled to the package substrate through the interposer 234 and the first terminal 235a of the first capacitor 232a. The parallel coupling can be utilized, for example, when the first terminal 235a of the first and second capacitors 232a, 232b are of the same type (e.g., receive the same input bias and/or are both ground terminals).

As further illustrated in FIG. 2, the second terminal 235b of the second capacitor 232b can be electrically coupled to an additional bonding location 218 on the package substrate 110 through a capacitor bond wire 244. In the illustrated embodiment, the capacitor bond wire 244 is directly coupled to the second terminal 235b of the second capacitor 232b (e.g., on a top of the second capacitor 232b). The independent coupling of the second terminals 235b of the first and second capacitors 232a, 232b can allow the first and second capacitors 232a, 232b to be individually coupled to other components (e.g., to various groups of the stacked dies 126 and/or the controller die 122 of FIG. 1).

Each of the subcomponents of the stacked capacitor component 230 can be at least partially vertically aligned. For example, in the embodiment illustrated in FIG. 2, the second capacitor 232b generally fits within a longitudinal footprint of the first capacitor 232a (e.g., the first and second capacitors 232a, 232b are generally vertically aligned). Similarly, in the illustrated embodiment, the interposer 234 is generally vertically aligned with the capacitors 232. As a result of the stacked configuration and vertical alignment, as discussed above, the stacked capacitor component 230 can reduce the longitudinal space on the package substrate 110 required for multiple capacitors. The reduction in space required for the capacitors can reduce the overall size of the stacked semiconductor device (e.g., device 100 of FIG. 1) and/or provide additional space for signal routing structures in the redistribution layer 116 (FIG. 1). Purely by way of example, the stacked capacitor component 230 can provide additional space for bond fingers adjacent to a die stack. In turn, the additional space for bond fingers can allow additional connections to the dies in the space adjacent to a die stack, thereby increasing the functionality of the resulting stacked semiconductor device and/or reducing the additional space necessary for the connections. In another example, stacking the first and second capacitors 232a, 232b can reduce the peripheral space needed for the capacitors by a length (or width) of the first and second capacitors 232a, 232b and the space needed to mount the first and second capacitors 232a, 232b. As a result, the stacked capacitor component 230 can reduce the longitudinal space on the package substrate 110 required for multiple capacitors by at least one of the dimensions of the capacitor.

Figure 3:
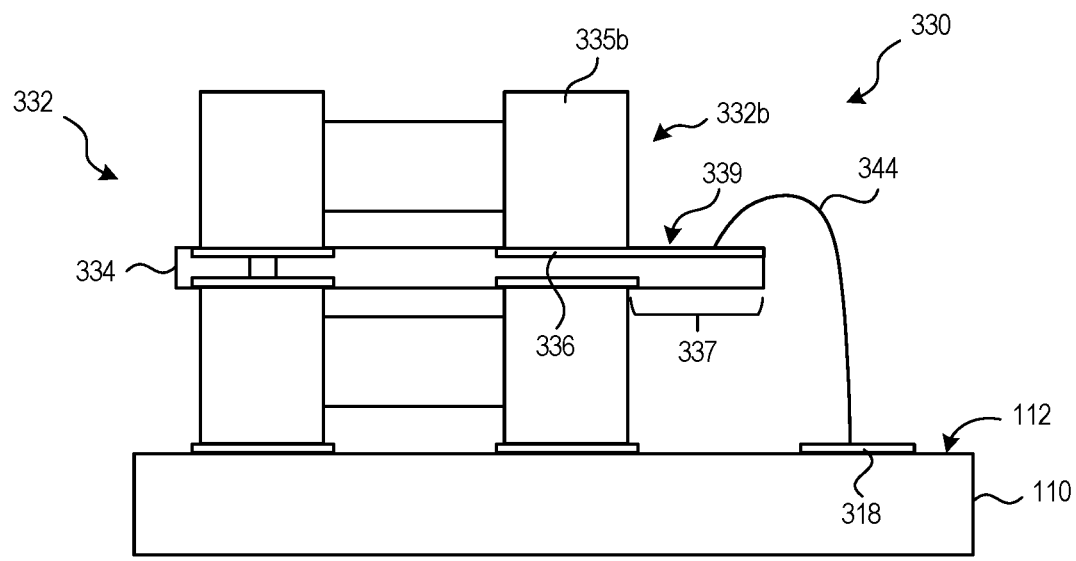
FIG. 3 is a partially schematic cross-sectional view of a stacked capacitor component configured in accordance with further embodiments of the present technology.

FIG. 3 is a partially schematic cross-sectional view of a stacked capacitor component 330 configured in accordance with further embodiments of the present technology. As illustrated in FIG. 3, the stacked capacitor component 330 is generally similar to the stacked capacitor component 230 discussed above with reference to FIG. 2. For example, the stacked capacitor component 330 includes two or more capacitors 332 (two shown) and an interposer 334.

In the illustrated embodiment, however, the interposer 334 includes a porch 337 that extends beyond the longitudinal footprint of the capacitors 332 and overhangs the package substrate 110. Further, the interposer 334 includes a bonding region 339 (e.g., a redistribution layer with a contact pad, a bond finger, and the like) on an upper surface of the porch 337 that is electrically coupled to an intermediate bond region 336. The second terminal 335b of the second capacitor 332b can be electrically coupled to the intermediate bond region 336, thereby electrically coupling the second capacitor 332b to the bonding region 339 on the porch 337. As further illustrated in FIG. 3, the bonding region 339 on the porch 337 can be electrically coupled to an additional bonding location 318 on the package substrate 110 through a capacitor bond wire 344.

In some embodiments, the shorter length of the capacitor bond wire 344 in FIG. 3 (e.g., as compared to the capacitor bond wire 244 in FIG. 2) can be less likely to be damaged during later manufacturing processes and/or provide a shorter signal travel length to the second capacitor 332b. However, the smaller longitudinal footprint of interposers (e.g., the interposer 234 of FIG. 2) can reduce the size of a stacked capacitor component more than the stacked capacitor component 330 with the porch 337.

Figure 4:
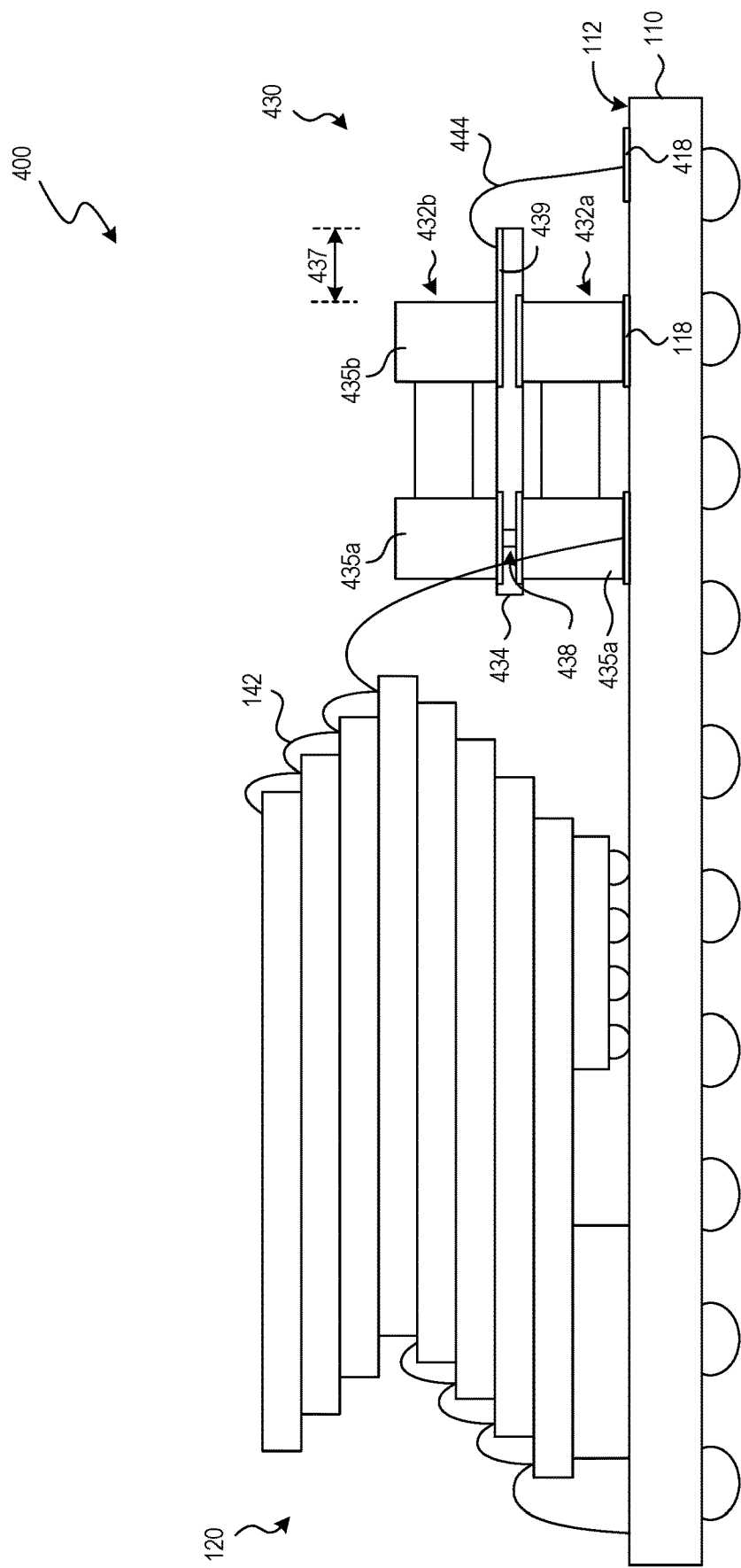
FIG. 4 is a partially schematic cross-sectional view of a semiconductor device configured in accordance with further embodiments of the present technology.

FIG. 4 is a partially schematic cross-sectional view of a stacked semiconductor device 400 configured in accordance with further embodiments of the present technology. As illustrated in FIG. 4, the stacked semiconductor device 400 ("device 400") is generally similar to the device 100 discussed above with reference to FIG. 1. For example, the device 400 includes the package substrate 110, the die stack 120 carried by the first surface 112 of the package substrate 110, and a stacked capacitor component 430 carried by first surface 112 adjacent to the die stack 120. In the illustrated embodiment, however, the stacked capacitor component 430 is of the type discussed above with reference to FIG. 3.

For example, as illustrated in FIG. 4, the stacked capacitor component 430 includes a first capacitor 432a, an interposer 434 attached to the first capacitor 432a, and a second capacitor 432b attached to the interposer 434. The first and second terminals 435a, 435b of the first capacitor 432a are attached and electrically coupled to corresponding bonding locations 118 on the first surface 112; the interposer 434 is attached and electrically coupled to the first and second terminals 435a, 435b of the first capacitor 432a through intermediate bond regions 436 on the lower surface of the interposer 434; and the first and second terminals 435a, 435b of the second capacitor 432b are attached and electrically coupled to intermediate bond regions 436 on the upper surface of the interposer 434. Further, the first terminal 435a of the second capacitor 432b is electrically coupled the first terminal 435a of the first capacitor 432a through a conductive via 438 in the interposer 434.

As further illustrated in FIG. 4, the interposer 434 can include a porch 437 with a bonding region 439 formed thereon. The bonding region 439 is electrically coupled to the intermediate bond regions 436 attached to the second terminal 435b of the second capacitor 432b (e.g., via contact and/or a generally continuous conductive material therebetween). The bonding region 439 is also coupled to an additional bonding location 418 on the first surface 112 through a capacitor bond wire 444, thereby coupling the second terminal 435b of the second capacitor 432b to the additional bonding location 418.

In the illustrated embodiment, the inclusion of the porch 437 in the interposer 434 provides space between the capacitor bond wire 444 and the die bond wires 142 attached to the die stack 120. As a result, the porch 437 can help reduce the chance that any of the die and capacitor bond wires 124, 444 are damaged and/or form an electrical short during manufacturing (e.g., due to wire sweep). Additionally, or alternatively, the porch 437 can create additional space immediately adjacent to the die stack 120 for additional die bond wires 142 to be attached to form connections to the die stack 120.

Figure 5:
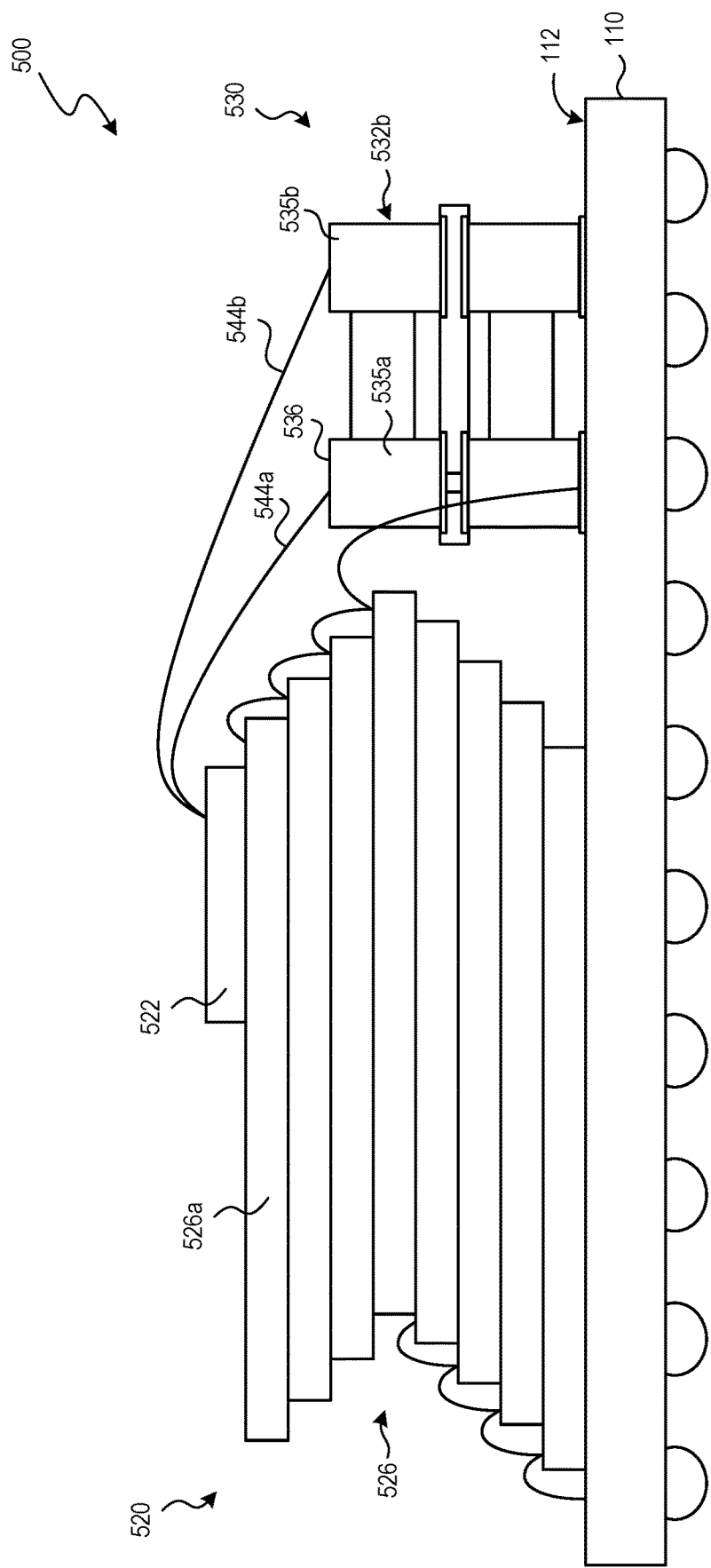
FIG. 5 is a partially schematic cross-sectional view of a semiconductor device configured in accordance with further embodiments of the present technology.

FIG. 5 is a partially schematic cross-sectional view of a stacked semiconductor device 500 configured in accordance with further embodiments of the present technology. As illustrated in FIG. 5, the stacked semiconductor device 500 ("device 500") is generally similar to the device 100 discussed above with reference to FIG. 1. For example, the device 500 includes the package substrate 110, a die stack 520 carried by the first surface 112 of the package substrate 110, and a stacked capacitor component 530 carried by first surface 112 adjacent to the die stack 520.

In the illustrated embodiment, however, the die stack 520 includes one or more stacked dies 526 (eight shown) attached to the first surface 112 and a controller die 522 that is attached to an uppermost die 526a of the stacked dies 526. Further, the device 500 includes first and second capacitor bond wires 544a, 544b electrically coupled between the controller die 522 and an upper surface 536 of the first and second terminals 535a, 535b (respectively) of the second capacitor 532b in the stacked capacitor component 530.

In such embodiments, the first capacitor 532a can be electrically coupled the package substrate 110 through one or more solder joints (e.g., as discussed above) to serve any suitable component of the device 500 while the second capacitor 532b is electrically coupled directly to the controller die 522. The direct coupling between the second capacitor 532b and the controller die 522 can reduce the signal travel time therebetween and, in turn, increase the operating speed of the device 500. Additionally, or alternatively, the direct coupling can further reduce the number of bond wires attached to the package substrate 110. The reduction of bond wires attached to the package substrate 110 can, in turn, reduce the longitudinal footprint of the device 500 and/or provide room for additional connections to be formed. Still further, the illustrated embodiment does not require a spacer (e.g., the spacer 124 of FIG. 1), which can reduce the cost of materials required to manufacture the device 500.

Figure 6:
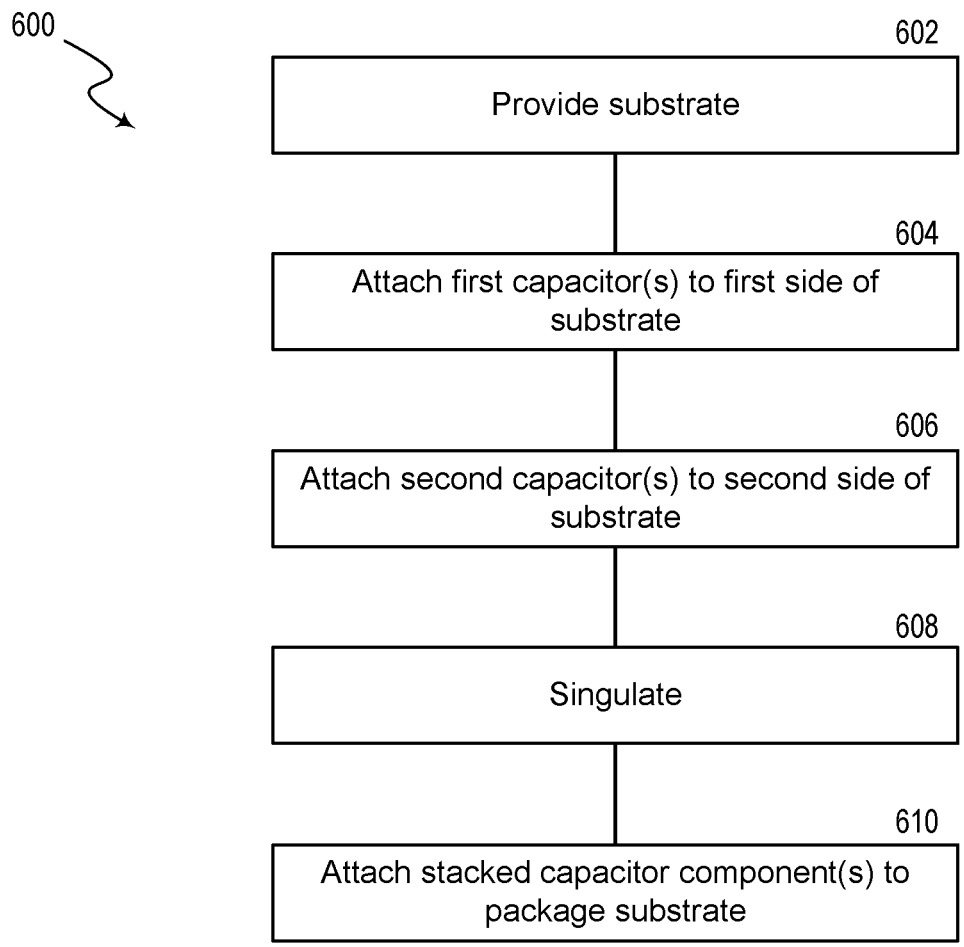
FIG. 6 is a flow diagram of a process for manufacturing stacked capacitor components in accordance with some embodiments of the present technology.

FIG. 6 is a flow diagram of a process 600 for manufacturing stacked capacitor components in accordance with some embodiments of the present technology. As discussed below, the process 600 can be executed at a wafer level to manufacture the stacked capacitor components in bulk or can be completed on an individual component basis.

The process 600 begins at block 602 by providing an interposer. The interposer can include one or more conductive features (e.g., bonding regions, redistribution structures, and the like) formed on top and bottom surfaces of the substrate. In some embodiments, the interposer is provided in a wafer to allow stacked capacitor components to be manufactured in bulk. In some embodiments, the interposer is provided after singulation from another bulk process, for example allowing stacked capacitor components to be manufactured as needed for semiconductor devices and/or in other electronic components.

At block 604, the process 600 includes attaching one or more first capacitors to a first side of the interposer. For example, in bulk processes, block 604 can include attaching a plurality of the first capacitors to the first side of the interposer. In some embodiments, the first capacitors are attached to the conductive features on the first side of the interposer via a solder joint (e.g., using an SMT process). In various other embodiments, the first capacitors can be attached through metal-metal bonds, various other suitable solder reflow processes, and the like.

At block 606, the process 600 includes attaching one or more second capacitors to a second side of the interposer. Each of the second capacitors can be attached generally opposite a corresponding first capacitor, thereby at least partially vertically aligning corresponding pairs of the first and second capacitors. Similar to the first capacitors, the second capacitors can be attached to the conductive features on the second side of the interposer via a solder joint (e.g., using an SMT process), metal-metal bonds, various other suitable solder reflow processes, and the like.

In some embodiments, the process 600 can implement blocks 606 and 604 in reverse order to attach the second capacitors to the second side before attaching the first capacitors to the first side. In some embodiments, the process 600 can cycle through blocks 602-606 multiple times to stack additional capacitors into a single stacked capacitor component. For example, the process 600 can include providing a second interposer and attaching the second interposer to an upper surface of the second capacitors, then attaching third capacitors to an upper surface of the second interposer. In such embodiments, for example, the first interposer can include a porch (e.g., the porch 337 of FIG. 3) to allow each of the second capacitors to later be coupled to a package substrate.

At optional block 608, the process 600 includes singulating individual stacked capacitor components. Optional block 608 allows each of the individual stacked capacitor components to be isolated when manufacturing in a bulk process. In embodiments, where the stacked capacitor components are manufactured on an individual level, the process 600 can skip optional block 608. In various embodiments, the singulation can be completed through a dicing process, a dry etch, a wet etch, a laser etch, and/or any other suitable process.

At block 610, the process 600 includes attaching a completed stacked capacitor component to an appropriate location on a package substrate. In some embodiments, block 610 is completed before attaching the die stack to the package substrate. In some embodiments, block 610 is completed after attaching one or more of the dies in the die stack to the package substrate. In various embodiments, attaching the stacked capacitor component includes forming a solder joint, metal-metal bond, and/or any other suitable connection between the first capacitor and conductive features on the package substrate. Additionally, attaching the stacked capacitor component can include forming one or more capacitor bond wires between the second capacitor and the package substrate, between the interposer and the package substrate, and/or between the second capacitor and a die in the die stack (e.g., the controller die).

Figure 7A:
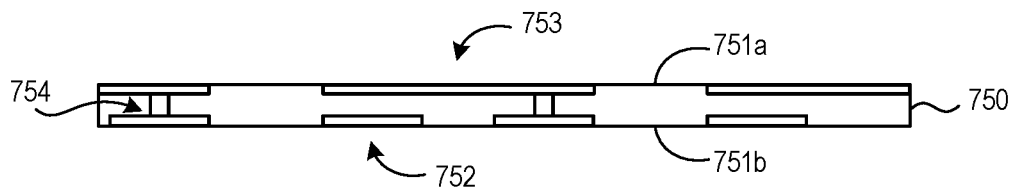
FIGS. 7A-7D are partially schematic cross-sectional views illustrating the stacked capacitor components at various stages of the process of FIG. 6 in accordance with some embodiments of the present technology.

FIGS. 7A-7D are partially schematic cross-sectional views illustrating the stacked capacitor components at various stages of the process 600 of FIG. 6 in accordance with some embodiments of the present technology. For example, FIG. 7A illustrates the process after providing the interposer 750. In the illustrated embodiment, the interposer 750 includes a first side 751a and a second side 751b opposite the first side 751a. Each of the first and second sides 751a, 751b include conductive features 752 (e.g., bonding regions, redistribution structures, and the like) formed thereon. Further, the interposer 750 includes one or more (two shown) conductive vias 754 extending between conductive features 752 on the first and second sides 751a, 751b.

Figure 7B:
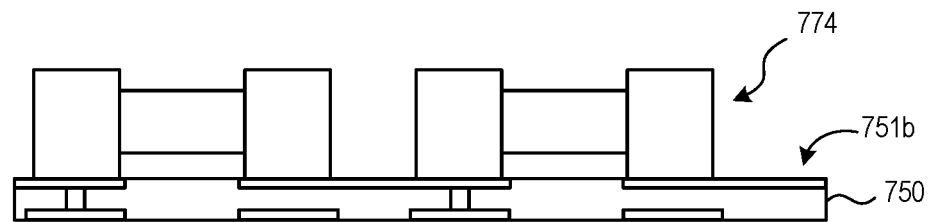
Figure 7C:
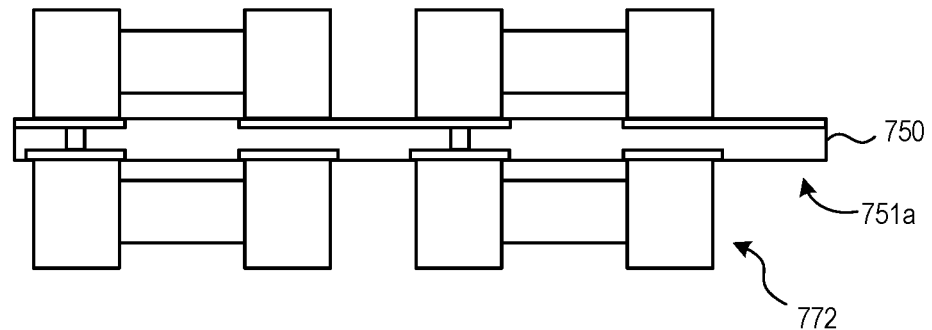

FIG. 7B illustrates the process after attaching one or more second capacitors 764 (two shown) to the second side 751b of the interposer 750. FIG. 7C illustrates the process after attaching one or more first capacitors 762 (two shown) to the first side 751a of the interposer 750 generally opposite a corresponding one of the second capacitors 764. As discussed above, the first and second capacitors 762, 764 can be attached in at least partial vertical alignment, thereby allowing the completed stacked capacitor component to require less longitudinal space than separate capacitors.

Figure 7D:
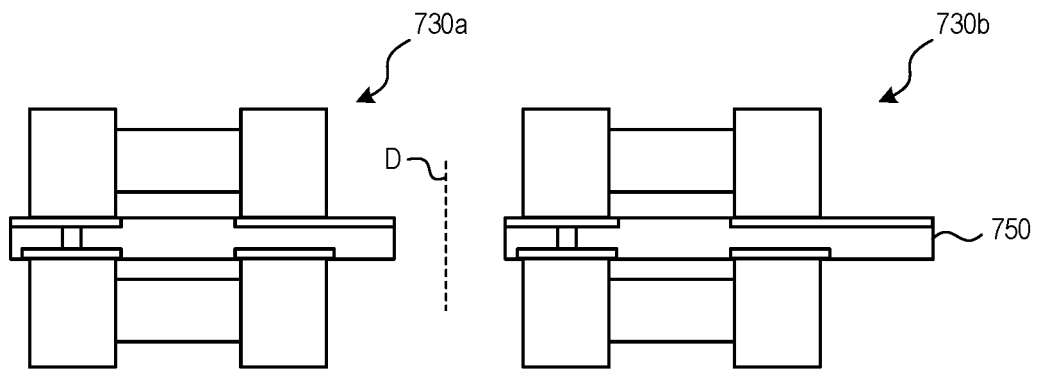

FIG. 7D illustrates the process after singulating individual ones of the stacked capacitor components (two shown, a first stacked capacitor component 730a and a second stacked capacitor component 730b) along dicing line D. In the illustrated embodiment, the dicing line D separates the first stacked capacitor component 730a from the second stacked capacitor component 730b at a position to create a porch 737 on the first stacked capacitor component 730a. In embodiments that do not include the porch 737, the first and second stacked capacitor components 730a, 730b can be packed closer together and/or the dicing line D can be closer to a middle line between the first and second stacked capacitor components 730a, 730b. In some embodiments, the process can include one or more additional dicing and/or etching steps to remove excess material from the interposer 750, thereby reducing the longitudinal footprints of the first and second stacked capacitor components 730a, 730b.

Figure 8A:
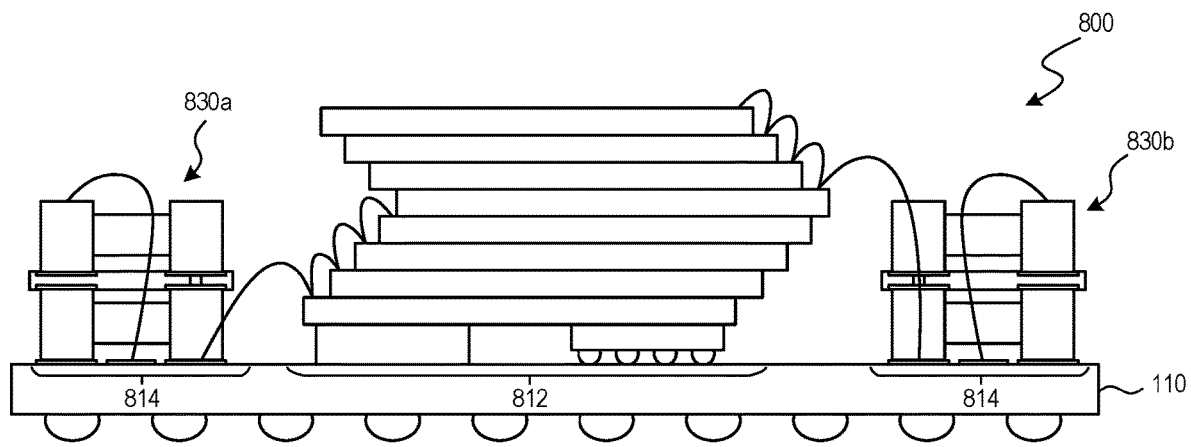
FIGS. 8A and 8B are partially schematic cross-sectional and plan views, respectively, of a semiconductor device configured in accordance with further embodiments of the present technology.
Figure 8B:
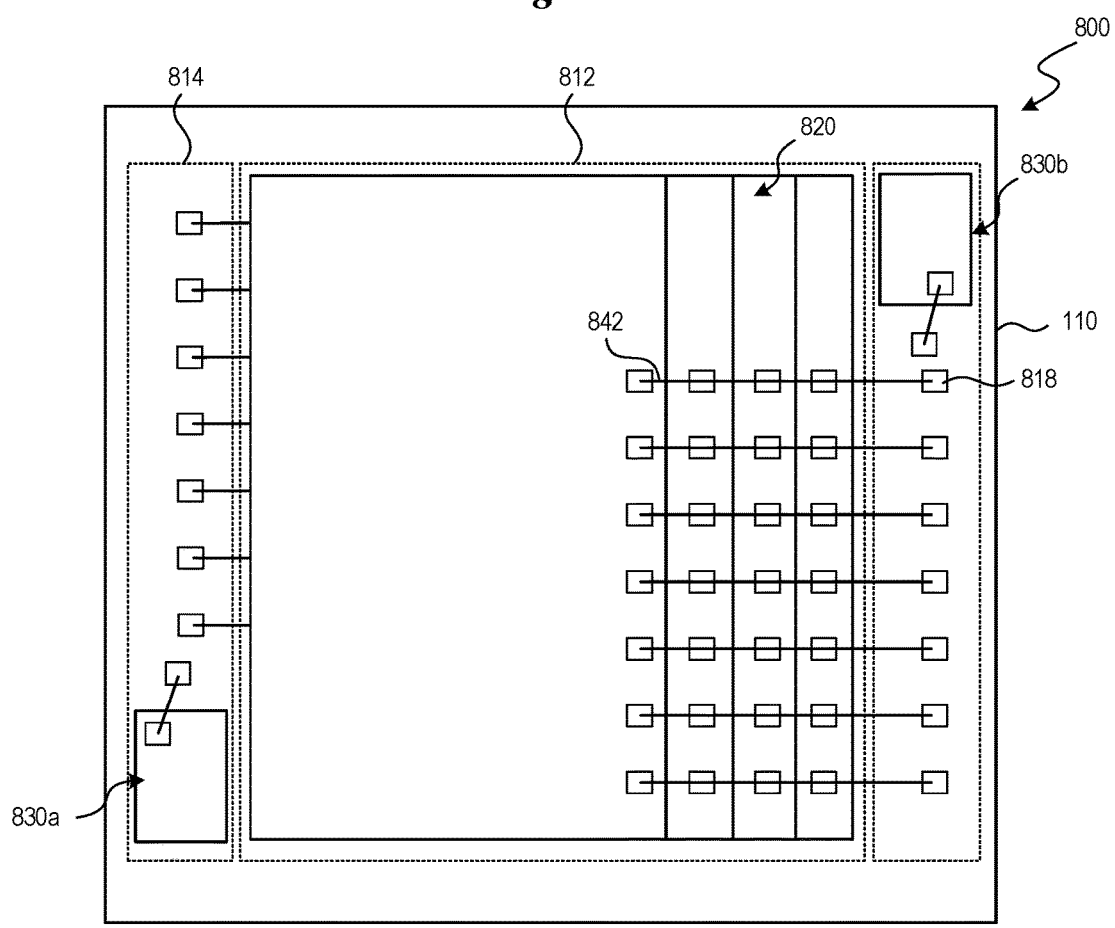

FIGS. 8A and 8B are partially schematic cross-sectional and plan views, respectively, of a stacked semiconductor device 800 configured in accordance with further embodiments of the present technology. As best illustrated in FIG. 8A, the stacked semiconductor device 800 ("device 800") is generally similar to the device 100 discussed above with reference to FIG. 1. For example, the device 800 includes the package substrate 110 and a die stack 820 carried by the first surface 112 of the package substrate 110.

In the illustrated embodiment, however, the device 800 can include two or more stacked capacitor components 830 (two shown, referred to individually as a first stacked capacitor component 830a and a second stacked capacitor component 830b). The inclusion of multiple stacked capacitor components 830 provides additional capacitors to the die stack 820 (or other relevant components) and allows the device 800 to meet continuing industry demands for increased processing power for each semiconductor device without increasing the height of the stacked capacitor components 830 above the height of the die stack 820.

As illustrated in FIGS. 8A and 8B, the die stack 820 can be carried by a stacking region 812 (sometimes also referred to as a die-stacking portion and/or a central region) of the package substrate 110 while each of the stacked capacitor components 830 can be carried by a peripheral region 814 (sometimes also referred to as a peripheral circuitry region, a redistribution region, and/or an outside portion) of the package substrate 110. As best illustrated in FIG. 8B, each of the peripheral regions 814 can also include one or more bonding regions 818 (seven shown) corresponding to die bond wires 842 from the die stack 820. The inclusion of multiple capacitors in each of the stacked capacitor components 830 can provide additional real estate in the peripheral region 814 for the bonding regions 818 (e.g., as compared to having each of the capacitors attached to the package substrate 110 in the peripheral region 814). As a result, damage and/or electrical shorts resulting from wire sweep can be less common. Additionally, or alternatively, the additional real estate can provide flexibility in the placement of the bonding regions 818, corresponding bond fingers and/or other redistribution features, and/or the die stack 820.

Additionally, or alternatively, the peripheral region 814 can have a smaller longitudinal footprint (e.g., as compared to having each of the capacitors attached to the package substrate 110 in the peripheral region 814) because less room is needed to include each of the capacitors independently and/or to space the included capacitors from each other. As a result, the inclusion of multiple of the stacked capacitor components 830 can further reduce the longitudinal footprint of the package substrate 110 (and therefore the device 800 overall). For example, the inclusion of two stacked capacitor components 830 can reduce the longitudinal space in the peripheral regions 814 by a distance equal to (or greater than) a width (or length) of two capacitors. The reduction reflects the space savings from each stacked capacitor, along with space savings associated with the clearance space that is not required for the stacked capacitors. In a specific, non-limiting example, the inclusion of two stacked capacitor components 830 can reduce an overall width of the device 800 from about 9.2 millimeters to about 8.4 millimeters, or by about 8.7 percent.

It will be understood that, in various embodiments, the stacked semiconductor devices discussed herein can include one or more additional, or alternative, components. For example, in some embodiments, the stacked semiconductor device includes an encapsulant that partially (or fully) covers the die stack and/or the stacked capacitor component(s). The encapsulant can protect the die stack, the stacked capacitor component(s), and/or the die and capacitor bond wires from damage during manufacturing and/or transportation. In another example, although the interposer in the stacked capacitor component has been illustrated and described herein primarily as comprising one or more layers of a printed circuit board material, the interposer can be comprised of another suitable material. Purely by way of example, the interposer can be comprised of a semiconductor substrate (e.g., a silicon substrate) with the relevant conductive features formed thereon. In yet another example, the die stack has been primarily illustrated and discussed herein as electrically coupled to the package substrate through die bond wires. However, the die stack can be coupled to the package substrate through flip chip connections (e.g., solder structures bonding and electrically intercoupling each of the dies), metal-metal bonds, and the like.

Figure 9:
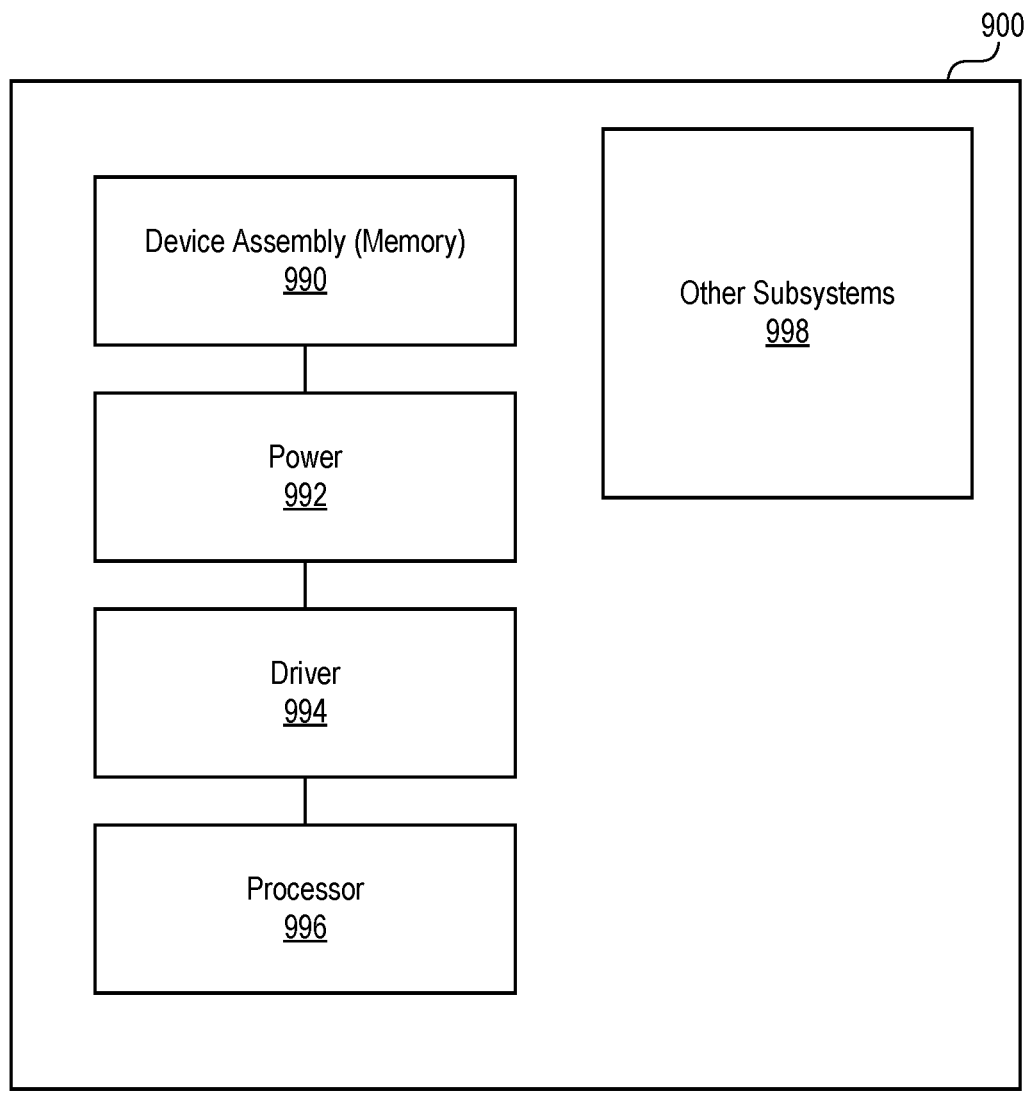
FIG. 9 is a schematic view of a system that includes a semiconductor die assembly configured in accordance with embodiments of the present technology.

FIG. 9 is a schematic view of a system that includes a semiconductor die assembly configured in accordance with embodiments of the present technology. That is, the semiconductor device assemblies discussed above can be incorporated into any of a myriad of larger and/or more complex systems, a representative example of which is system 900 shown schematically in FIG. 9. The system 900 can include a memory 990 (e.g., SRAM, DRAM, flash, and/or other memory devices), a power supply 992, a drive 994, a processor 996, and/or other subsystems or components 998. Semiconductor assemblies having stacked capacitor components of the type discussed above with reference to FIGS. 1-8B can be included in any of the elements shown in FIG. 9. Purely by way of example, the stacked capacitor components can be deployed in the memory 990 (e.g., in a managed NAND for us in various consumer electronics, automotive electronics, and the like; an SSD package; and/or any other suitable memory device) to reduce the size of the memory 990.

The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, automotive electronics, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other examples, the system 900 can be housed in a single unit or distributed over multiple interconnected units, e.g., through a communication network.

The components of the system 900 can accordingly include local and/or remote memory storage devices and any of a wide variety of suitable computer-readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Further, the terms "generally", "approximately," and "about" are used herein to mean within at least within 10 percent of a given value or limit. Purely by way of example, an approximate ratio means within ten percent of the given ratio.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments.

Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device assembly, comprising:
   a package substrate having an inner surface;
   one or more semiconductor dies carried by the inner surface, wherein each of the one or more semiconductor dies is electrically coupled to the inner surface by one or more bond wires; and
   a stacked capacitor device carried by the inner surface, wherein the stacked capacitor device comprises:
   a first capacitor having a lower surface attached to the inner surface of the package substrate and an upper surface opposite the lower surface;
   an interposer having a first side attached to the upper surface of the first capacitor, a second side opposite the first side, and a conductive via; and
   a second capacitor attached to the second side of the interposer, wherein a first terminal of the first capacitor is electrically coupled to the inner surface of the package substrate, and wherein a second terminal of the second capacitor is electrically coupled to the first terminal through the conductive via.

2. The semiconductor device assembly of claim 1 wherein the first terminal and the second terminal are ground terminals.

3. The semiconductor device assembly of claim 1, further comprising a bond wire electrically coupling a terminal of the second capacitor to the inner surface of the package substrate.

4. The semiconductor device assembly of claim 1 wherein the interposer includes a porch region overhanging the package substrate and a bonding region on the second side in the porch region, wherein the first terminal of the second capacitor is electrically coupled to the bonding region, and wherein the semiconductor device assembly further comprises a bond wire electrically coupling the bonding region to the inner surface.

5. The semiconductor device assembly of claim 1 wherein the one or more semiconductor dies includes a controller die, and wherein the semiconductor device assembly further comprises a bond wire electrically coupling at least one terminal of the second capacitor directly to the controller die.

6. The semiconductor device assembly of claim 5, further comprising a second bond wire electrically coupling a second terminal of the second capacitor directly to the controller die.

7. The semiconductor device assembly of claim 1 wherein corresponding terminals in the first and second capacitors are vertically aligned.

8. A semiconductor device assembly, comprising:
a package substrate having an upper surface that includes a stacking region and a peripheral region; and
a multi-capacitor component carried by the peripheral region, wherein the multi-capacitor component comprises:
a first capacitor having a lower surface attached to the upper surface of the package substrate and a top surface opposite the lower surface, wherein the first capacitor is electrically coupled to a first bond pad on the upper surface of the package substrate via a solder connection;
an interposer having a first side attached to the top surface of the first capacitor and a second side opposite the first side; and
a second capacitor attached to the second side of the interposer, wherein the second capacitor is electrically coupled to a second bond pad on the upper surface of the package substrate via a bond wire.

9. The semiconductor device assembly of claim 8 wherein the bond wire is directly coupled to a terminal of the second capacitor.

10. The semiconductor device assembly of claim 8 wherein the second capacitor is electrically coupled to a bond finger on the first side of the interposer, and wherein the bond wire is coupled between the bond finger and the second bond pad.

11. The semiconductor device assembly of claim 8 wherein the first capacitor has a first footprint, and wherein the second capacitor has a second footprint generally equal to the first footprint.

12. The semiconductor device assembly of claim 8 wherein the first capacitor is vertically aligned with the second capacitor.

13. The semiconductor device assembly of claim 8, further comprising a die stack that includes a controller die at a top of the die stack, and wherein the second capacitor is electrically coupled to the controller die via two or more bond wires.

14. A method for manufacturing a stacked semiconductor device, the method comprising:
forming a stacked capacitor component, wherein forming the stacked capacitor component comprises:
providing an interposer comprising a first surface, a second surface opposite the first surface, first bond regions on the first surface, and second bond regions on the second surface opposite the first bond regions, wherein the interposer further comprises a conductive via extending between a corresponding pair of one of the first bond regions and one of the second bond regions;
attaching a first capacitor to the first bond regions; and
attaching a second capacitor to the second bond regions such that at least a portion of the second capacitor is vertically aligned with the first capacitor, wherein attaching the second capacitor includes electrically coupling a first terminal of the second capacitor the corresponding pair;
mounting the stacked capacitor component to a peripheral region of a package substrate;
mounting one or more semiconductor dies to a central region of the package substrate; and
electrically coupling a second terminal of the second capacitor in the stacked capacitor component to the package substrate through one or more bond wires.

15. The method of claim 14 wherein mounting the stacked capacitor component to the peripheral region of the package substrate includes forming a solder joint between the first capacitor and the package substrate, and wherein the solder joint electrically couples the first capacitor to the package substrate.

16. The method of claim 14 wherein attaching the first capacitor includes electrically coupling a first terminal of the first capacitor the corresponding pair such that the first terminal of the second capacitor is electrically coupled to the first terminal of the first capacitor through the conductive via.

17. The method of claim 14 wherein the second terminal includes one or more bond pads at an upper surface of the second capacitor and wherein electrically coupling the second capacitor in the stacked capacitor component to the package substrate includes forming the one or more bond wires between the package substrate and the one or more bond pads at the surface of the second capacitor.

18. The method of claim 14 wherein the interposer further includes a porch with a redistribution structure electrically coupled to one of the second bond regions, and wherein electrically coupling the second terminal of the second capacitor in the stacked capacitor component to the package substrate includes forming the one or more bond wires between the package substrate and the redistribution structure on the porch.

* * * * *